United States Patent [19]
Russell et al.

[11] Patent Number: 5,637,828
[45] Date of Patent: Jun. 10, 1997

[54] HIGH DENSITY SEMICONDUCTOR PACKAGE

[75] Inventors: Ernest J. Russell, Richmond; Daniel A. Baudouin; Duy-Loan T. Le, both of Missouri City; James Wallace, Sugar Land, all of Tex.

[73] Assignee: Texas Instruments Inc., Dallas, Tex.

[21] Appl. No.: 483,676

[22] Filed: Jun. 7, 1995

Related U.S. Application Data

[62] Division of Ser. No. 134,035, Oct. 8, 1993, Pat. No. 5,483,024.

[51] Int. Cl.$^6$ .................................................. H01L 23/28
[52] U.S. Cl. ........................ 174/52.2; 257/787; 257/723
[58] Field of Search ........................... 174/52.1, 52.2, 174/52.3, 52.4; 361/723, 813, 820; 257/666, 676, 685, 686, 723, 724, 725, 787

[56] References Cited

U.S. PATENT DOCUMENTS

| | | | |
|---|---|---|---|
| 4,975,763 | 12/1990 | Baudouin | 257/696 |
| 5,014,112 | 5/1991 | Gelsomini | 174/52.4 X |
| 5,327,325 | 7/1994 | Nicewarner, Jr. | 174/52.4 X |
| 5,331,235 | 7/1994 | Chun | 257/777 |

Primary Examiner—Bot L. Ledynh
Attorney, Agent, or Firm—William W. Holloway; Leo N. Heiting; Rich L. Donaldson

[57] ABSTRACT

The invention discloses a high density semiconductor package. Two semiconductor chips are each affixed on a corresponding one of two lead frames. The semiconductor chips and the lead frames are encapsulated, wherein only a portion of the leads of the lead frames protrudes and extends from the package.

14 Claims, 5 Drawing Sheets

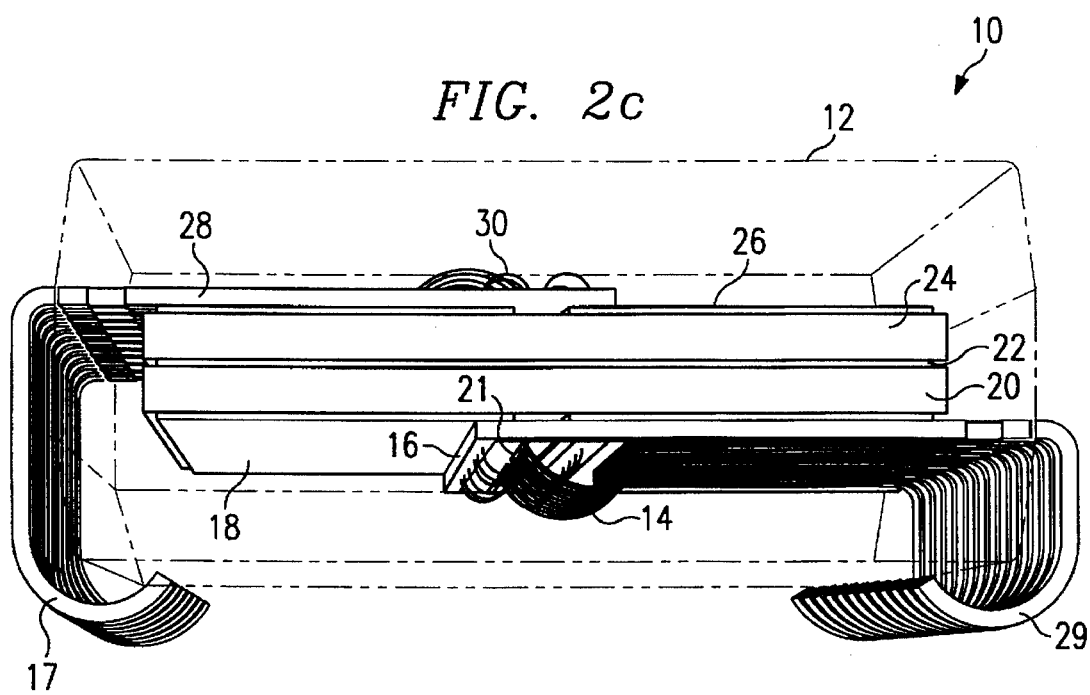

HIGH DENSITY SEMICONDUCTOR PACKAGE

This is a division of application Ser. No. 08/134,035, filed Oct. 8, 1993, now U.S. Pat. No. 5,483,024.

CROSS-REFERENCE TO RELATED APPLICATIONS

Concurrently filed U.S. patent application Ser. No. 08/134,149, entitled "Semiconductor Package Having Interdigitated Leads," is hereby incorporated by reference.

TECHNICAL FIELD OF THE INVENTION

This invention relates in general to the field of semiconductor devices and semiconductor packages having semiconductor integrated circuit chips and, more particularly, to a method and apparatus for providing high-density semiconductor packages.

BACKGROUND OF THE INVENTION

Semiconductor integrated circuit chips are usually encapsulated in a protective package made of plastic, metal, or ceramic material. The package is hermetically sealed to insulate the semiconductor chip from the effects of temperature extremes, humidity, and unintentional electrical contacts. The package has a plurality of conductive leads protruding from the encapsulation material for connecting to external devices on a printed circuit board. Various types of semiconductor packages are commonly used in the art, including sealed metal cans, plastic and ceramic dual-inline packages, small-outlining packages, and various flat packages.

Most semiconductor packages contain only one semiconductor chip per package. There is a need to increase the density of a semiconductor package to include two or more chips in one package. A high density package having multiple chips would increase the component density on a printed circuit board. Such a high density semiconductor package also would maximize space utilization on a printed circuit board and further increase the number of active elements on the printed circuit board. Currently, thin vertical packages are used to increase component density on a printed circuit board. See, e.g., U.S. Pat. No. 4,975,763, entitled "Edge-mounted, Surface-mount Package For Semiconductor Integrated Circuit Devices," issued Dec. 4, 1990 to Boudouin, et al. By mounting the thin package vertically, a greater number of packages can be accommodated on a printed circuit board.

In the prior art, component density on a printed circuit board may be increased by using a chip module containing multiple single chip packages. An example of such a chip module is the Single inline Memory Module (SIMM). However, SIMM packages are bulky and do not significantly reduce the amount of space required. With respect to encapsulating multiple chips in one package, U.S. Pat. No. 5,014,112, entitled "Semiconductor Integrated Circuit Device Having Mirror Image Circuit Bars Bonded On Opposite Sides Of A Lead Frame," issued May 7, 1991, to Gelsomini, discloses a semiconductor package having two identical semiconductor chips mounted on a single lead frame. However, a package having one lead frame only provides a limited number of leads. In certain applications, semiconductor packages having more leads are required. For example, high density memory chips require more leads that currently available in a single lead frame. Therefore, a need has arisen for semiconductor packages encapsulating a plurality of semiconductor chips and having at least two rows of conductive leads.

SUMMARY OF THE INVENTION

In accordance with the present invention, a method and apparatus for providing high density semiconductor packages is disclosed. More particularly, the present invention discloses a semiconductor package encapsulating a plurality of semiconductor chips. In a preferred embodiment, two semiconductor chips and two lead frames are encapsulated in a package. Each semiconductor chip has a plurality of electrical interface points on the surface of the chip. Each semiconductor chip is mounted on a separate lead frame having a plurality of leads. The electrical interface points on each chip are electrically connected to the corresponding leads on the respective lead frame. The semiconductor chips and the lead frames are positioned together such that the two semiconductor chips are side by side and sandwiched between the two lead frames. A chip separation material may be interposed between the two chips. Art encapsulation material surrounds and hermetically seals the semiconductor chips and most of the lead frames. A portion of each of the lead frames protrudes and extends from the encapsulation material.

An advantage of the present invention is that the component density of the semiconductor package is increased without substantially increasing the space requirement for mounting such a package on a printed circuit board.

Another advantage of the present invention is that the high density package may be manufactured using standard packaging components and techniques.

Another advantage of the present invention is that different semiconductor chips may be encapsulated in one package.

Another advantage of the present invention is that it may optimize the pin layout and routing on a printed circuit board.

BRIEF DESCRIPTION OF THE DRAWINGS

For a more complete understanding of the present invention and the advantages thereof, reference is now made to the following descriptions taken in conjunction with the accompanying drawings in which like reference numbers indicate like features and wherein:

FIGS. 2a–2c are interior views of the high density package corresponding to that depicted in FIG. 1;

FIG. 3b is an exterior view with a partial interior view of the semiconductor package corresponding to that depicted in FIG. 3a;

DETAILED DESCRIPTION

Figure 1:
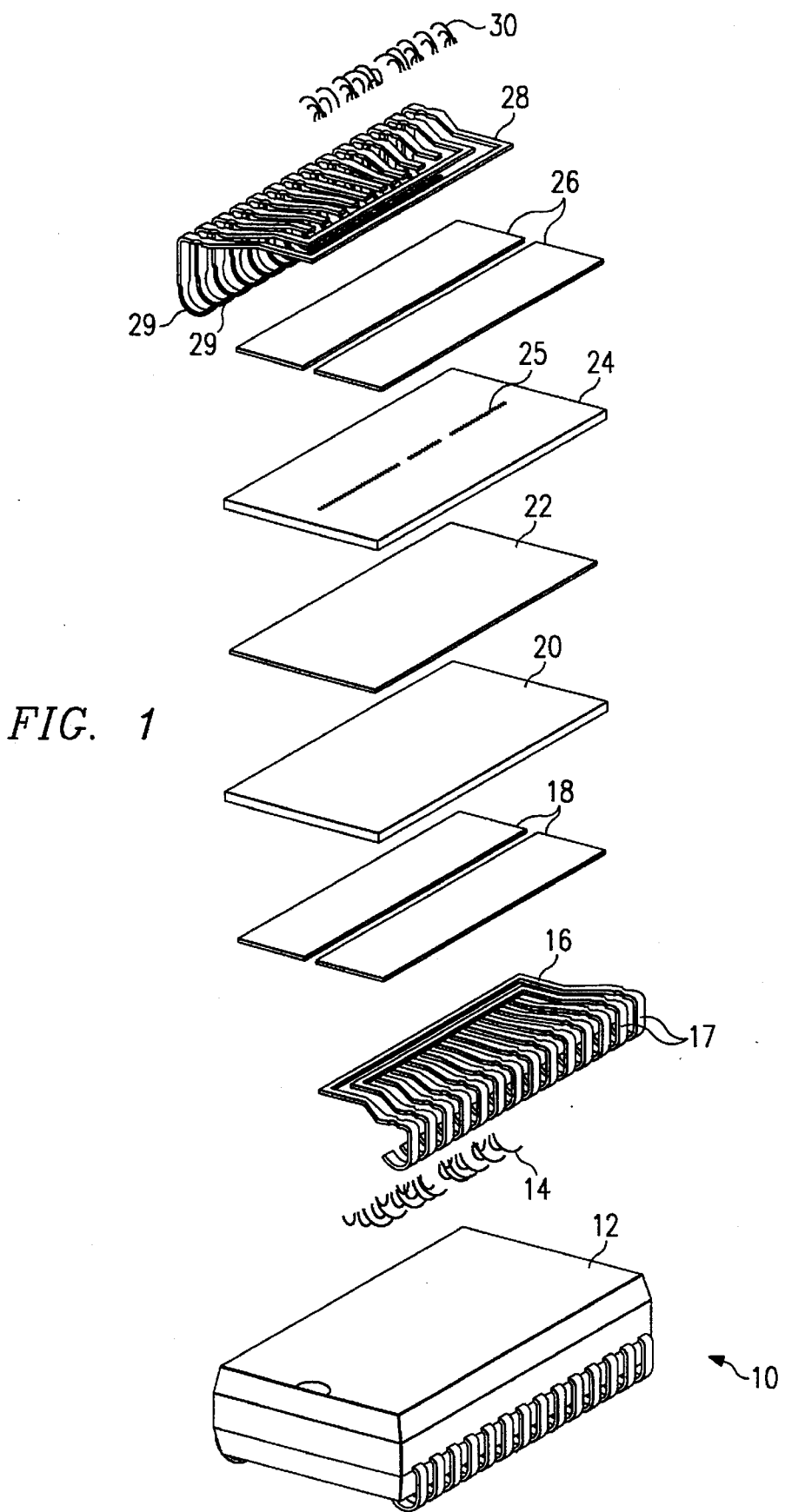
FIG. 1 is an exploded view of an embodiment of the present invention depicting a semiconductor package having two semiconductor chips and two lead frames.

FIG. 1 is an exploded view (also commonly referred to as an isometric projection) of a high density semiconductor package indicated generally at 10. The package 10 comprises a first and second semiconductor integrated circuit chips 20, 24, a first and second lead frames 16, 28, a first and second sets of bonding wires 14, 30, a first and second adhesive tapes 18, 26, a chip separator material 22, and an encapsulation material 12.

Referring to FIG. 1, the first lead frame 16 having a plurality of leads 17 is attached to the first semiconductor chip 20 using the first adhesive tape 18. The first semiconductor chip 20 has a plurality of electrical interface points 21, commonly referred to as bonding pads, in the middle of the chip 20 (not shown in FIG. 1; shown in FIG. 2c). The bonding pads 21 on the first semiconductor chip 20 are electrically connected to their corresponding leads 17 on the first lead frame 16 using the first set of bonding wires 14. Similarly, the second lead frame 28 having a plurality of leads 29 is attached to the second semiconductor chip 24 using the second adhesive tape 26. The second set of bonding wires 30 are used to electrically connect the electrical interface points 25 or bonding pads of the second semiconductor chip 24 to their corresponding leads 29 on the second lead frame 28. In other embodiments of the semiconductor chips, the bonding pads may be placed on the edge of the chips, e.g., see FIG. 3a and the location of bonding pads 45. Typically lead frames are configured and shaped according to the placement of the bonding pads on the semiconductor chip.

The first and second semiconductor chips 20, 24, along with their corresponding lead frames 16, 28, respectively, are oriented and stacked together such that semiconductor chips 20, 24 are sandwiched between their corresponding lead frames 16, 28. The chip separation material 22 is interposed between the first and second semiconductor chips 20, 24. The separation material 22 may be composed of an electrically insulating material or a heat dissipating material such as a heat sink. If electrical interface between the semiconductor chips is desired, the separation material 22 may comprise an electrically conductive material selectively incorporated in the separation material 22 to provide for connections between the two semiconductor chips 20, 24.

The semiconductor chips 20, 24 and portions of their corresponding lead frames 16, 28 are surrounded and enclosed within the encapsulation material 12. The preferred encapsulation material is molded plastic, which is commonly used in the art for encapsulating semiconductor chips and the like. Other encapsulation materials may also be used, such as ceramics or metals. The encapsulation material 12 encloses and hermetically seals all of the semiconductor chips 20, 24 and most of the lead frames 16, 28, leaving only a portion of the leads 17, 29 of the lead frames 16, 28 protruding from the encapsulation material 12. The protruding portions of leads 17, 29 provide electrical connections of the semiconductor chips 20, 24 encapsulated in the package 10 to a printed circuit board (not shown). In FIG. 1, the protruding portions of leads 17, 29 for each lead frame 16, 28 protrude and extend from opposite sides of the semiconductor package 10. A package having such lead configuration is commonly referred to as a small outline J-leaded package.

Figure 2A:
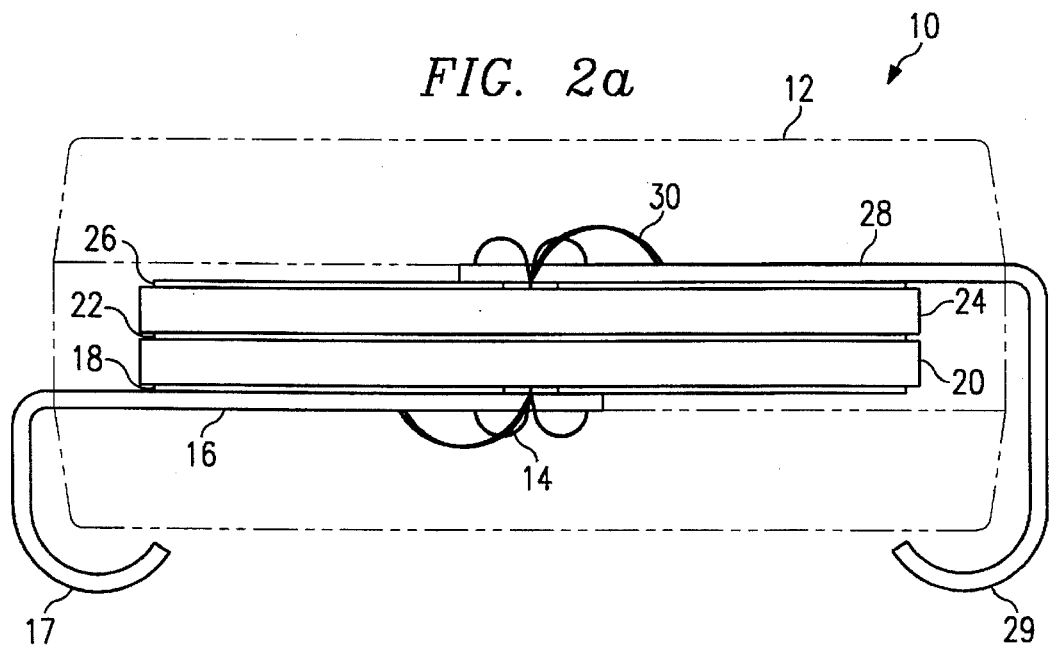

FIG. 2a is an interior side view of the semiconductor package 10. FIG. 2a illustrates that the first and second semiconductor chips 20, 24 are attached to their respective lead frames 16, 28 via adhesive tapes 18, 26. The semiconductor chips 20, 24 are stacked together and sandwiched between the first and second lead frames 16, 28. A chip separation material 22 is interposed between the semiconductor chips 20, 24. First and second sets 14, 30 of bonding wires provide the electrical connections between the semiconductor chips' bonding pads (not shown in FIG. 2a; shown in FIGS. 2b and 2c) and their corresponding leads 17, 29 on each of the respective lead frames 16, 28. The protruding portions of leads 17, 29 of the lead frames 16, 28 extend from the semiconductor package 10 different heights. However, the ends of the leads 17, 29 are positioned below the package 10 at the same level to facilitate the placement and attachment of the package 10 on a printed circuit board (not shown).

Figure 2B:
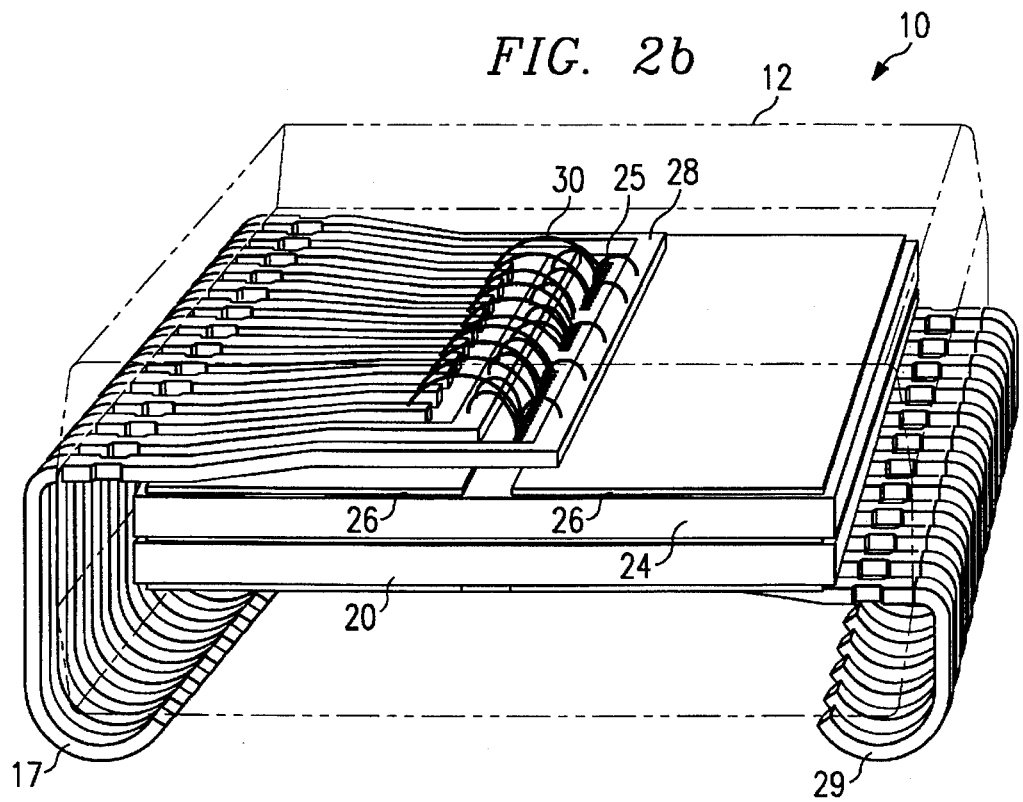

FIGS. 2b–2c provide further illustrations of the semiconductor package 10 encapsulating the semiconductor chips 20, 24 and the lead frames 16, 28. FIG. 2b is an interior top view of the package 10, illustrating that the second lead frame 28 is placed on the second semiconductor chip 24 and attached using the second adhesive tape 26. The bonding pads 25 of the second semiconductor chip 24, located in the middle of the chip 24, are electrically connected to their corresponding leads 29 on the second lead frame 28 using the second set of bonding wires 30. FIG. 2c is an interior bottom view of the package 10, illustrating that the first lead frame 16 is attached to the first semiconductor chip 18 using the first adhesive tape 18. The bonding pads 21 of the first semiconductor chip 18, located in the middle of the chip 18, are electrically connected to their corresponding leads 17 on the first lead frame 16 using the first set of bonding wires 14.

Figure 3A:
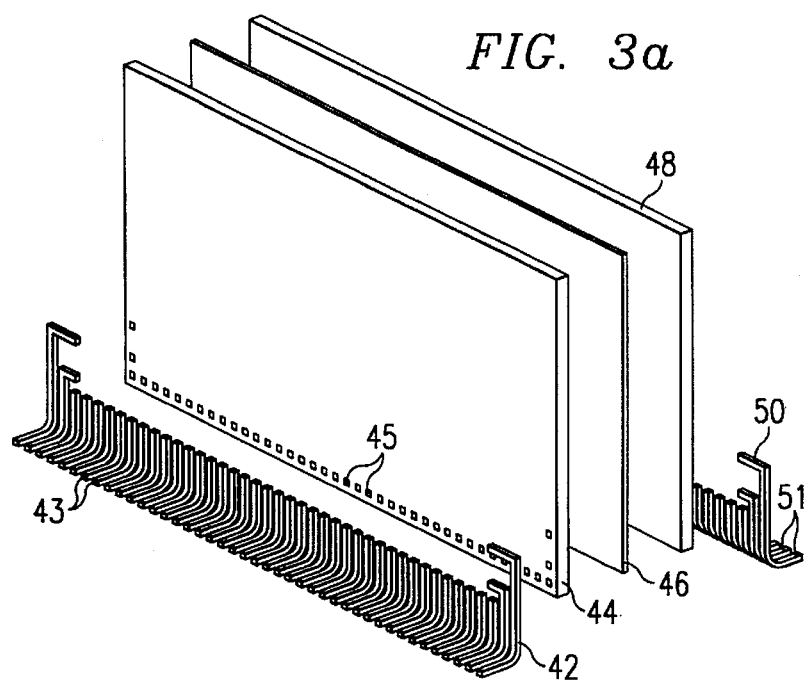
FIG. 3a is an exploded view of another embodiment of the present invention depicting a thin vertically mounted package having two semiconductor chips and two lead frames.
Figure 3B:
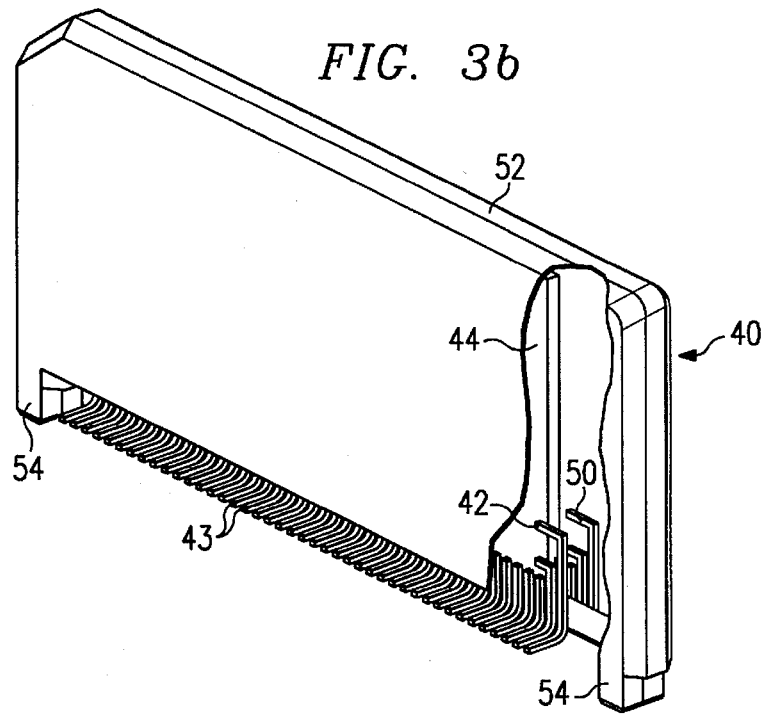

Another embodiment of a high density semiconductor package is illustrated in FIGS. 3a and 3b. In an exploded view, FIG. 3a illustrates a first and second semiconductor chips 44, 48 and a first and second lead frames 42, 50, which are stacked together and encapsulated in a vertically mounted thin package 40, as illustrated in FIG. 3b. Such a vertical thin semiconductor package is commonly referred to as a VPAK or ZIP.

Figure 4:
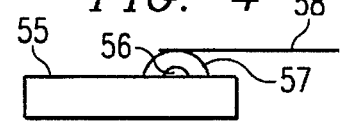
FIG. 4 is a cross-sectional view of a lead electrically attached to an electrical interface point on the surface of a semiconductor chip.

Referring to FIG. 3a, the first lead frame 42 having a plurality of leads 43 is attached directly to the bonding pads 45 of the first chip 44. Similarly, the second lead frame 50 having a plurality of leads 51 is attached directly to the bonding pads (not shown; similar to bonding pads 45) of the second semiconductor chip 48. Both lead frames 42, 50 may be attached directly to the bonding pads of their respective semiconductor chips 44, 48 using any direct lead attachment process. One process for such direct attachment is the tape automated bonding (TAB) process, which is well known in the art. As illustrated in FIG. 4, in the TAB process, a conductive layer 57 is deposited on top of a bonding pad 56 of a semiconductor chip 55 to form a "bump". The resulting 57 layer or bump allows the direct attachment of a lead 58. Using the TAB process, leads on a lead frame may be directly attached to the bonding pads of a semiconductor chip, without the use of bonding wires.

In addition to the TAB process for connecting a semiconductor chip's bonding pads to leads on a lead frame, lead frames utilizing the wire bonding method also may be used in a thin vertical package, such as illustrated in FIGS. 2b and 2c.

FIG. 3b illustrates that the semiconductor chips 44, 48 and the lead frames 42, 50 are stacked together such that the chips 44, 48 are sandwiched between the lead frames 42, 50 and the protruding portions of the leads 43, 51 extend from the same side of the package 40. A chip separation material 46 is interposed between the semiconductor chips 44, 48. The separation material 46 may be composed of an insulation material with adhesive substance coated on both sides of the insulation material for joining and positioning the semiconductor chips 44, 48. The separation material also may be composed of a heat dissipating material, such as a heat sink, or selectively incorporated conductive material to allow for electrical connection between the two semiconductor chips, thereby allowing the two semiconductor chips to interface with each other.

As further illustrated in FIG. 3b, the semiconductor chips 44, 48 and their respective lead frames 42, 50 are enclosed and hermetically sealed in an encapsulation material 52, wherein the protruding portions of leads 43, 51 (not shown) of the lead frames 42, 50 protrude from one side of the package 40. To facilitate vertical mounting of the package 40 on a printed circuit board (not shown), the package 40 has mounting or positioning posts 54 on both ends of the side where the leads 43, 51 protrude from the package 40. The posts 54 allow the package 40 to be vertically mounted on the printed circuit board (not shown) and further provide for the positioning of the leads 43, 51 for soldering on the printed circuit board.

Figure 5A:
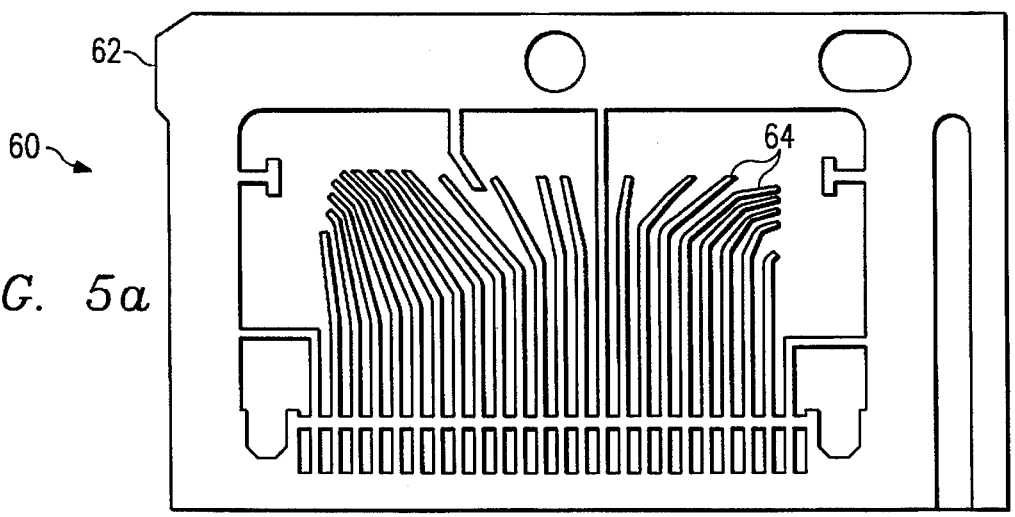
FIG. 5a depicts a lead-on-chip (LOC) lead frame.
Figure 5B:
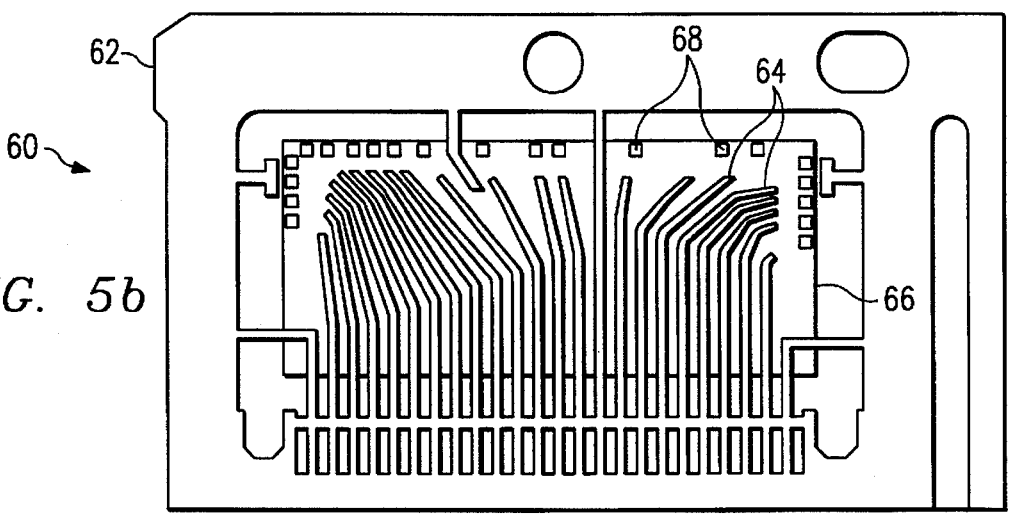
FIG. 5b is a view of the LOC lead frame mounted on a semiconductor chip.
Figure 5C:
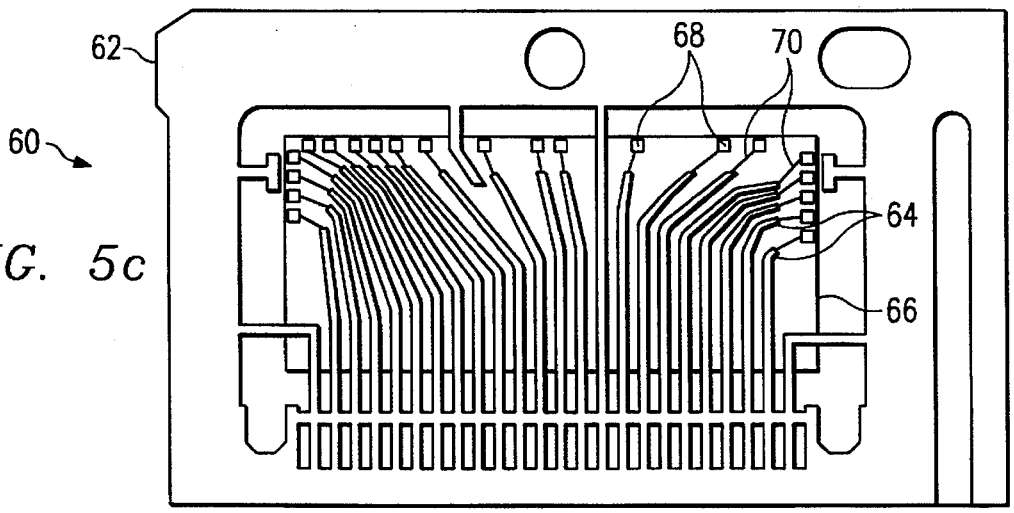
FIG. 5c is a view of the LOC lead frame mounted on the semiconductor chip, wherein each of the leads is wire bonded to a corresponding electrical bonding pad on the semiconductor chip.

A high density semiconductor package can be manufactured using standard lead frames and standard chip assembly process. A commonly used lead frame is the lead-over-chip (LOC) lead frame 60, as depicted in FIG. 5a. A flat plastic support frame 62 surrounds the leads 64 to provide rigidity to the metal alloy leads 64 and allows for mounting of the leads 64 to a semiconductor chip. The support frame 62 is removed after the encapsulation process. The LOC lead frame is designed to be placed on top of a semiconductor chip having a plurality of bonding pads. As illustrated in FIG. 5b, the lead frame 60 is placed on the surface of a semiconductor chip 66 having a plurality of bonding pads 68 located near the edge of the chip 66. The lead frame 60 is mounted to the semiconductor chip 66 using an adhesive tape (not shown). Referring to FIG. 5c, once the lead frame 60 is mounted on the semiconductor chip 66, the bonding pads 68 of the semiconductor chip 66 are electrically connected to their corresponding leads using bond wires 70. The resulting semiconductor chip and lead frame assembly is commonly referred to as a chip assembly. Furthermore chip assemblies may be individually encapsulated and later joined to form a high density package.

To assemble one high density package, two chip assemblies are required. In general, the two chip assemblies for one package are identical, i.e., the lead frames are the same and the semiconductor chips are the same. However, two different chip assemblies may be used in one package. If desired, two different types of chips, using different types of lead frames, may be encapsulated together in one package.

In the next manufacturing step, the two chip assemblies are joined together. Examples of two embodiments where the chip assemblies are joined together are FIGS. 2a and 3b. Referring to FIG. 2a, the two semiconductor chips 20, 24 are stacked together and positioned such that the semiconductor chips 20, 24 are sandwiched between their respective lead frames 16, 28. The leads for the chip assemblies may be directed in various configuration. In one embodiment, as illustrated in FIG. 2a, the leads 17, 29 of the two lead frames 16, 28 are positioned such that they extend in opposite directions. In another embodiment, as illustrated in FIG. 3a, the leads 43, 51 of the two lead frames 42, 50 are positioned such that the leads 43, 51 extend in the same direction. Such a lead configuration is used in a thin vertical package, such as VPAK or ZIP. Leads may be positioned in other configurations, depending on the packaging requirements.

Once the leads are positioned in the desired configuration, the semiconductor chips and portions of the lead frames are surrounded and hermetically sealed using an encapsulation material. The preferred encapsulation material is molded plastic; however, other encapsulation materials may be used, such as ceramics or metals. Once encapsulated, only the outer portion of the leads protrudes from the encapsulation material. After encapsulation, the support frames 62 for the chip assemblies are removed and the exposed outer leads are trimmed and shaped, using conventional techniques. For example, the outer leads may be shaped as J-leads, as illustrated in FIG. 2a (leads 17, 29), gull-wing leads, as illustrated in FIG. 3a (leads 43, 51), or interdigitated leads, as disclosed in concurrently filed U.S. patent application Ser. No. 08/134,149.

Although the present invention has been described in detail, it should be understood that various changes, substitutions, and alterations can be made hereto without departing from the spirit and scope of the invention as defined by the following claims.

What is claimed is:

1. A semiconductor integrated circuit, comprising:
   first and second lead frames each having a plurality of leads;
   first and second semiconductor chips each having a plurality of electrical interface points;
   the first and second semiconductor chips each being affixed on the first and second lead frames, respectively, wherein each of the electrical interface points for each of the semiconductor chips is electrically connected to a corresponding one of the leads on the respective lead frame;
   the respective semiconductor chips and lead frames being stacked together and oriented such that the first and second semiconductor chips are positioned side by side and sandwiched between the first and the second lead frames; and
   a non-conductive material encapsulating the semiconductor chips and a portion of the lead frames, wherein the remaining portion of the leads of the lead frame protrudes from the non-conductive material.

2. The device according to claim 1, wherein the non-conductive material is a plastic molded around the semiconductor chips and a portion of the lead frames.

3. The device according to claim 1, wherein the electrical interface points are bonding pads and further comprising a plurality of bonding wires, wherein each of the plurality of boding wires electrically connects one lead of the plurality of leads to a corresponding one of the bonding pads.

4. The device according to claim 1, wherein the electrical interface points are bonding pads with each bonding pad covered with a layer of conductive material to form a bump that allows for the direct attachment of each bonding pad to a corresponding one of the leads.

5. The device according to claim 1, wherein the lead frames are positioned together and oriented such that the protruding leads of both of the lead frames are pointed in the same direction.

6. The device according to claim 1, wherein the lead frames are positioned together and oriented such that the protruding leads of one of the lead frames are pointed in the opposite direction from the protruding leads of the other of the lead frames.

7. The device according to claim 1, wherein the device forms a thin package, the package having mounting posts on one side of the package for vertical mounting of the package on a printed circuit board.

8. A semiconductor integrated circuit device, comprising:

a first lead frame having a plurality of leads;

a first semiconductor chip having a first and second surface, the first surface of the first semiconductor chip having a plurality of electrical interface points and being affixed on the first lend frame, wherein each of the electrical interface points of the first semiconductor chip is electrically connected to a corresponding lead of the first lead frame;

a second lead frame having a plurality of leads;

a second semiconductor chip having a first and second surface, the first surface of the second semiconductor chip having a plurality of electrical interface points and being affixed to the second lead frame, wherein each of the electrical interface points of the second semiconductor chip is electrically connected to a corresponding one of the leads of the second lead frame;

the respective semiconductor chips and lead frames being stacked together and oriented such that the second surfaces of the first and second semiconductor chips are facing each other and the semiconductor chips are sandwiched between the first and the second lead frames;

a chip separator material being interposed between the second surfaces of the first and second semiconductor chips; and a non-conductive material encapsulating the semiconductor chips and a portion of the leads of the lead frames, wherein the remaining portions of the leads of the lead frames protrude from the non-conductive material.

9. The device according to claim 8, wherein the non-conductive material is a plastic molded around the semiconductor chips and a portion of the lead frames.

10. The device according to claim 8, wherein the electrical interface points are bonding pads and further comprising a plurality of bonding wires, wherein each of the plurality of bonding wires electrically connects one lead of the plurality of leads to a corresponding one of the bonding pads.

11. The device according to claim 8, wherein the electrical interface points are bonding pads with each bonding pad covered with a layer of conductive material to form a bump that allows for the direct attachment of each bonding pad to a corresponding one of the leads.

12. The device according to claim 8, wherein the lead frames are positioned together and oriented such that the protruding leads of the first and second lead frames are pointed in the same direction.

13. The device according to claim 8, wherein the lead frames are positioned together and oriented such that the protruding leads of first lead frame are pointed in the opposite direction from the protruding leads of the second lead frame.

14. The device according to claim 8, wherein the device forms a thin package, the package having mounting posts on one side of the package for vertical mounting of the package on a printed circuit board.

* * * * *